US010765028B1

(12) United States Patent
Beall et al.

(10) Patent No.: US 10,765,028 B1
(45) Date of Patent: Sep. 1, 2020

(54) RACK COMPONENT RETENTION MECHANISMS

(71) Applicant: Amazon Technologies, Inc., Seattle, WA (US)

(72) Inventors: Christopher Strickland Beall, Woodinville, WA (US); Michael Jon Moen, Olympia, WA (US); Kevin Bailey, Seattle, WA (US); Brandyn David Giroux, Seattle, WA (US); Robert Hastings, Seattle, WA (US); Chen An, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 84 days.

(21) Appl. No.: 15/879,374

(22) Filed: Jan. 24, 2018

(51) Int. Cl.
*A47B 81/00* (2006.01)
*H05K 7/14* (2006.01)
*A47B 88/407* (2017.01)
*A47B 88/919* (2017.01)

(52) U.S. Cl.
CPC ......... *H05K 7/1489* (2013.01); *A47B 88/407* (2017.01); *A47B 88/919* (2017.01)

(58) Field of Classification Search
CPC .... H05K 7/1489; A47B 88/407; A47B 88/919
See application file for complete search history.

(56) References Cited

U.S. PATENT DOCUMENTS

| 492,646 A * | 2/1893 | Walker | E05B 45/06 200/61.64 |
| 5,975,592 A * | 11/1999 | Lin | B25G 3/18 292/159 |
| 6,547,289 B1 * | 4/2003 | Greenheck | E05B 65/46 292/100 |
| 6,851,286 B2 * | 2/2005 | Dube | E05B 65/46 292/336.3 |
| 9,091,831 B2 * | 7/2015 | Chatellard | H04Q 1/13 |
| 10,485,133 B1 * | 11/2019 | Revol | A47B 57/406 |
| 2003/0184196 A1 * | 10/2003 | Hung | G11B 33/124 312/332.1 |
| 2016/0150659 A1 * | 5/2016 | Chen | H05K 7/1487 312/223.2 |
| 2018/0228049 A1 * | 8/2018 | Liao | A47B 88/407 |

* cited by examiner

*Primary Examiner* — Matthew W Ing
(74) *Attorney, Agent, or Firm* — Kilpatrick Townsend & Stockton LLP

(57) ABSTRACT

Retention mechanisms for retaining compute components within server racks are described. In one example, a retention mechanism includes a latching component configured to move between a locked position and an unlocked position. The retention mechanism also includes a retaining component configured to position the latching component in the unlocked position. Movement of the retaining component releases the latching component thereby allowing the latching component to move into the locked position.

19 Claims, 7 Drawing Sheets

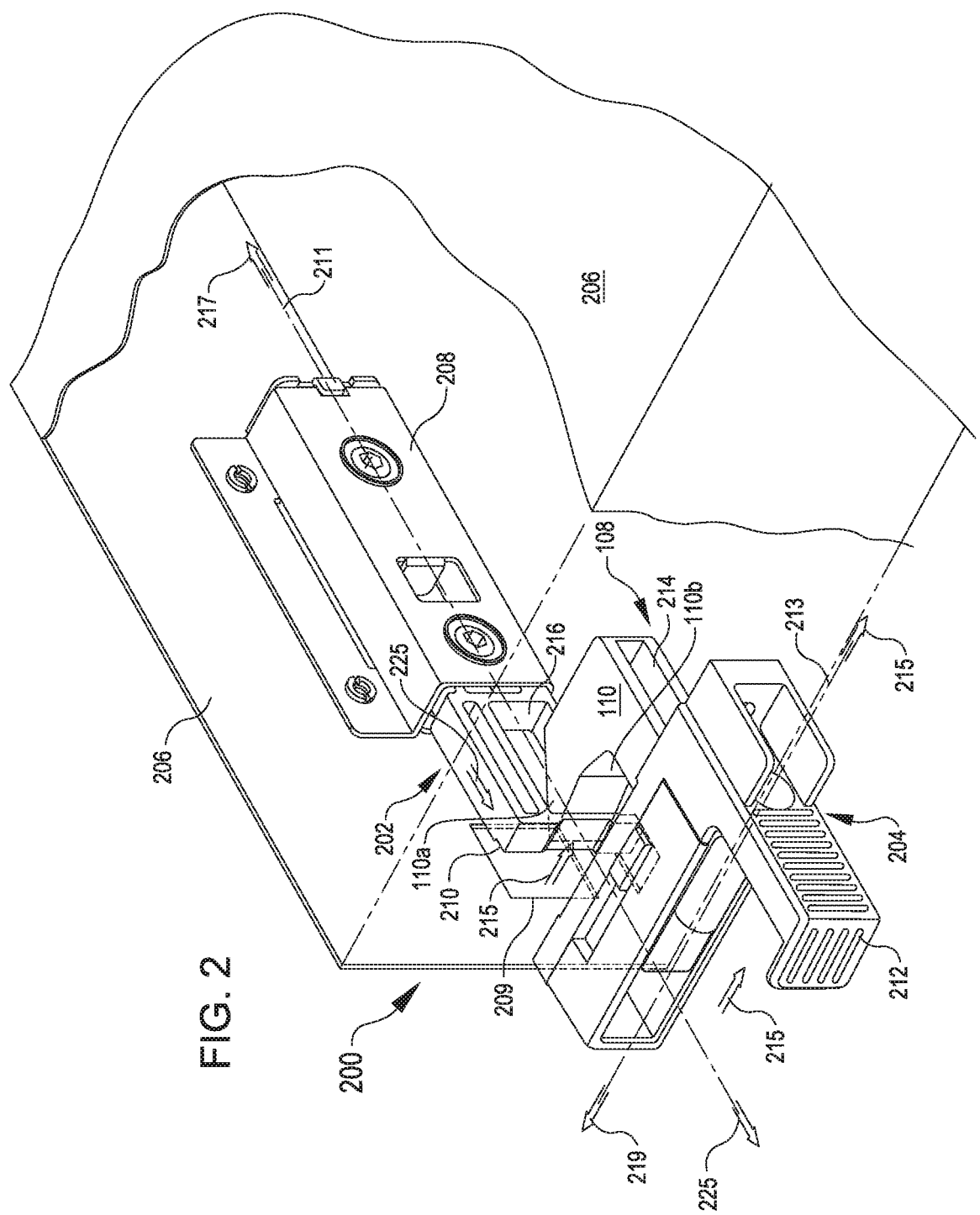

RACK COMPONENT RETENTION MECHANISMS

BACKGROUND

Rack components such as computer servers, network equipment, and other data center hardware can be stored in racks. These rack components may be supported in the racks on shelves and secured to the racks or shelves using combinations of screws or bolts.

BRIEF DESCRIPTION OF THE DRAWINGS

Various examples in accordance with the present disclosure will be described with reference to the drawings, in which:

FIG. 2 illustrates a perspective view of a system including a retention mechanism in a first state, according to at least one example;

DETAILED DESCRIPTION

Figure 1:
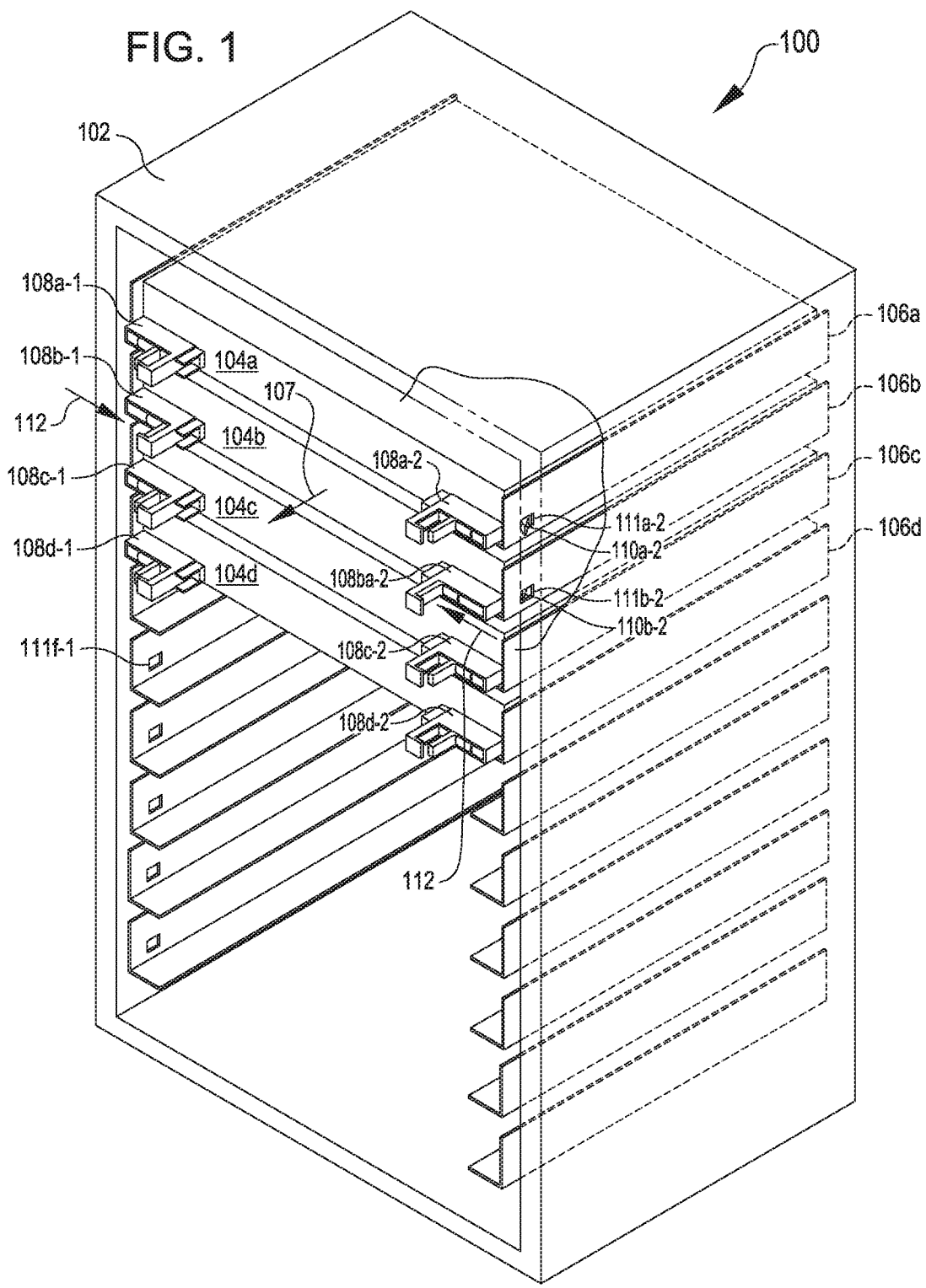
FIG. 1 illustrates a perspective view of a server retaining system including rack components, according to at least one example.

In the following description, various examples will be described. For purposes of explanation, specific configurations and details are set forth in order to provide a thorough understanding of the examples. However, it will also be apparent to one skilled in the art that the examples may be practiced without the specific details. Furthermore, well-known features may be omitted or simplified in order not to obscure the example being described.

Examples described herein are directed to systems and devices for retaining components in server racks in a manner that avoids use of tools, provides handles for use by installers, and minimizes potential obstructions along exterior surfaces of side walls of the compute chasses. Most conventional retaining mechanisms attach to server racks via support structures that terminate at the forward most vertical posts. This means that the forward-most surface of the compute component (e.g., the front face) may not extend beyond the forward-most vertical posts (or else the compute components would not be supported). Because of the latch member design including its slim profile and retractable latches, latches described herein allow for use of support structures such as "L" brackets that extend forward beyond the most-forward vertical posts. Because the L brackets extend beyond the most-forward vertical posts, larger (e.g., deeper) compute component chasses can be used. This results in increased rack density and overall reduction in datacenter footprint.

The retention mechanisms described herein may be implemented to physically retain any suitable rack-mounted component (e.g., hardware servers for computing or storage, networking hardware for switching or load balancing, power equipment, and any other suitable device that may be used within a datacenter and mounted within a rack) to a server rack. The retention mechanisms are connected to cases of the compute components, with first parts inside the case and second parts outside of the case. Once installed, the retention mechanisms may be operated without use of fasteners, or generic or specialized tools common to many current approaches for securing compute components to server racks (e.g., screws, bolts, plates, keys, etc.). For example, during installation of a compute component, exposed handles of the retention mechanisms can be gripped by a user (e.g., a network technician) and used to push the compute component into a server rack. During installation spring-loaded latches of the retention mechanisms are held in an unlocked position within a case of the compute component and thereby create obstruction-free exterior surfaces along side walls of the case. This reduces the possibility of the latches interfering with communication cables or other parts supported by the server rack or adjacent server racks. Once the compute component reaches a predefined position in the server rack, release mechanisms of the spring-loaded latches contact with the server rack. This contact automatically triggers the latches to move from the unlocked position to a locked position. In the locked position, the latches securely lock the compute component to the server rack. During removal, the same exposed handles can be used to draw back the latches to the unlocked position. The exposed handles can then be gripped to pull the compute component from the server rack (e.g., for maintenance, swapping of internal components, etc.). Again, because the latches are held within the case, the latches do not interfere with communication cables or other parts.

Turning now to a particular example, prior to loading a server component into a server rack, two retention mechanisms are connected to a case of the server component (e.g., one on each front corner of the case). Each component includes a retaining assembly installed on a side wall on the inside of the case and a latching assembly installed on a front wall on the outside of the case. The two assemblies each have spring-loaded sliding parts that interface with each other such that movement of the latching assembly (e.g., side-to-side at the front of the server component) causes movement of the retaining assembly in a different orthogonal direction (e.g., front-to-rear at the side of the server component). The sliding part of the retaining assembly includes a recess into which a distal tip of a latch member of the sliding part of the latching assembly is installed. In this arrangement, the retaining assembly is in an engaged position and contact between the recess and the distal tip is sufficient to retain the latching assembly in an unlocked position. When a spring of the sliding part of the retaining assembly is compressed, the recess moves thereby allowing the distal tip to extend past the recess, through an opening in the case, and into a locked position. In this arrangement, the retaining assembly is in a disengaged position and the latching assembly locks the case in the server rack.

The case of the server component can be supported in the server rack using a support structure (e.g., "L" brackets, "U"

brackets, support rails, etc.) connected to the server rack. As part of sliding the case of the server component on the support brackets, interference between a tab of the retaining assembly and a support bracket will compress the spring of the sliding part of the retaining assembly, as discussed. This causes translation of the sliding part that effectively disengages the retaining assembly and causes the latching assembly to move into the locked position (e.g., a latch extends through the case and into a corresponding latch opening in the support bracket). To remove the server component, the sliding part of the latching assembly is drawn back a sufficient distance until the distal tip is again positioned in the recess of the sliding part of the retention assembly.

Retention mechanisms may be implemented relative to a server rack, a network hardware rack, or a tape library rack. To avoid having to repeat varied terms throughout the description, as used herein in the specification and claims, any use of "rack" (even if modified specifically by "server," "network hardware," "compute component," or "tape library" etc.) may be utilized to mean any of a server rack, a network hardware rack, a compute component rack, a tape library rack, or a rack that includes any combination of these options.

Turning now to the figures, FIG. 1 illustrates a server retaining system 100 including a server rack 102 that supports various compute components 104a, 104b, 104c, and 104d within compute cases. The cases may include top sides, bottom sides, two opposing sides, front sides, and rear sides. In some examples, the cases may be formed from a rigid material such as metal and may be configured to receive and support different computing and networking elements that make up the compute components 104. At their rear sides, the cases may include power supply interfaces for connecting to a rack power supply associated with the server rack 102. At their front sides, the cases may include interfaces, ports, and the like for outputting and inputting data.

The server rack 102 includes a plurality of support brackets 106, a few of which are labeled, that support the compute components 104. The support brackets 106, which may have any suitable shape or form (e.g., "L" bracket, "U" bracket, rail, or any other suitable form of bracket), may be connected to the server rack 102 using any suitable technique (e.g., bolted, welded, snapped, etc.). When the support brackets 106 are L brackets, a pair of such brackets may be suitable for supporting a single compute component 104.

The support brackets 106 are sized and configured to receive the compute components 104 in a sliding configuration. For example, loading or unloading of the compute component 104b may include orienting the compute component 104b such that a bottom surface of the compute component 104b slides along a top surface (or a pair of top surfaces) of the support brackets 106b in the direction opposite arrow 107 for loading and in the direction of arrow 107 for unloading. In this configuration, back sides of the compute components 104 are the leading sides during installation and the trailing sides during removal.

Each compute component 104 includes a pair of retention mechanisms 108. The retention mechanisms 108 are mounted at front corners of cases of the compute components 104, with components mounted to front walls and side walls within the cases of the compute components 104. In some examples, the retention mechanisms 108 are mounted on other walls of the compute components 104. Generally speaking, the retention mechanisms 108 can be configured into one of two states, unlocked and locked. As illustrated in the cut-away view of the server rack 102, the retention mechanisms 108b-1 and 108b-2 are illustrated in the unlocked state. In this state, latch members 110b-1 and 110b-2 of the retention mechanisms 108b-1 and 108b-2 have been slide in the direction of arrow 112. For example, an human user may have pinched the retention mechanisms 108b-1 and 108b-2 together to cause the latch members 110b-1 and 110b-2 to slide away from vertical side walls of the support brackets 106b. In this state, the compute component 104b may be freely removed from the server rack 102 because the latch members 110b-1 and 110b-2 are retracted into the case of the compute component 104b.

The retention mechanisms 108a-1 and 108a-2 are illustrated in the locked state. In this state, latch members 110a-1 and 110a-2 of the retention mechanisms 108a-1 and 108a-2 extend through latch member openings of the case 104a of the compute component 104a and into latch member openings 111 (e.g., the latch member opening 111a-2) of the support bracket 106a. In this manner, the retention mechanisms 108 can be used to retain the compute components 104 to the support brackets 106. Such retaining may be suitable to meet shock and vibration design constraints for compute components 104. For example, the retention mechanisms 108 may be capable of retaining a 50 pound compute component in the server rack 102 in the event of a large scale earthquake, where the G force on the compute component may be very high.

The profile of the retention mechanisms 108 has been minimized to maximize available surface area on the front face of the compute component 104 for placement of interfaces, ports, and the like. Use of the retention mechanisms 108 may enable compute components 104 that are larger (e.g., deeper) than if traditional retaining methods were employed. Since the retention mechanisms 108 are connected at the front corners of the cases of the compute components 104, the support brackets 106, which are connected to vertical posts inside the server rack 102, can extend forward beyond the vertical posts to the front of the compute components 104.

FIGS. 2, 3A, and 3B and FIGS. 4, 5A, and 5B illustrate a system 200 including the retention mechanism 108 respectively in an unlocked position and a locked position. The retention mechanism 108 includes a retaining assembly 202 and a latching assembly 204.

The retaining assembly 202 includes a fixed component 208 and a retaining component 210. The fixed component 208 is connected to an interior surface of a side wall of a case 206 of a compute component (e.g., welded, crimped, bolted, riveted, or connected in any other suitable manner). The retaining component 210 is slidably coupled to the fixed component 208 such that the retaining component 210 can slide along an axis 211 with respect to the fixed component 208. The axis 211 extends along an elongated length of the retaining assembly 202 in a front-to-rear orientation of the case 206. Thus, sliding along the axis 211 may correspond to movement that is toward the front of the case 206 and movement that is toward the back of the case 206.

The latching assembly 204 includes a handle component 212 and a latching component 214. The handle component 212 is connected to an exterior surface of a front wall of the case 206 of the compute component (e.g., welded, crimped, bolted, riveted, or connected in any other suitable manner). The latching component 214 is slidably coupled to the handle component 212 such that the latching component 214 can slide along an axis 213 with respect to the handle component 212. The axis 213 extends across a width dimension of the latching assembly 204 in a side-to-side orientation of the case 206. Thus, sliding along the axis 213 may correspond to movement that is back and forth from one side of the case 206 to the other side of the case 206.

The latching component 214 of the latching assembly 204 interfaces with the retaining component 210 of the retaining assembly 202. In particular, the latch member 110 of the latching component 214 extends through an interaction opening 216 of the retaining component 210. The latch member 110 is the same member that extends through a latch member opening 209 disposed in the wall of the case 206 and within the latch member opening 111 in the support bracket 106 to hold the compute component 104 in the server rack 102, as shown in FIGS. 1, 4, 5A, and 5B.

The latch member 110 includes a plurality of surfaces that define its angled shape. Beginning with a distal tip 110a of the latch member 110, a first surface 110c connects to a second surface 110b. The first surface 110c is angularly disposed with respect to the second surface 110b such that the first surface 110c has an orientation that extends towards the handle component 212. The second surface 110b has a much flatter orientation as compared to the first surface 110c. As the latch member 110 (and the latching component 214) move along the axis 213, the different surfaces 110c, 110b, of the latch member 110 will interact differently on the interaction opening 216.

For example, given the angle of the first surface 110c, when this portion of the latch member 110 is disposed within the interaction opening 216, movement of the latching component 214 along the axis 213 in the direction of arrow 215 exerts a force on the retaining component 210 at the interaction opening 216 that causes the retaining component 210 to slide along the axis 211 in the direction of arrow 225. Movement in the direction of arrow 215 may correspond to a user squeezing the latching assembly 204 prior to installation of the compute component or as part of removal.

Figure 3A:
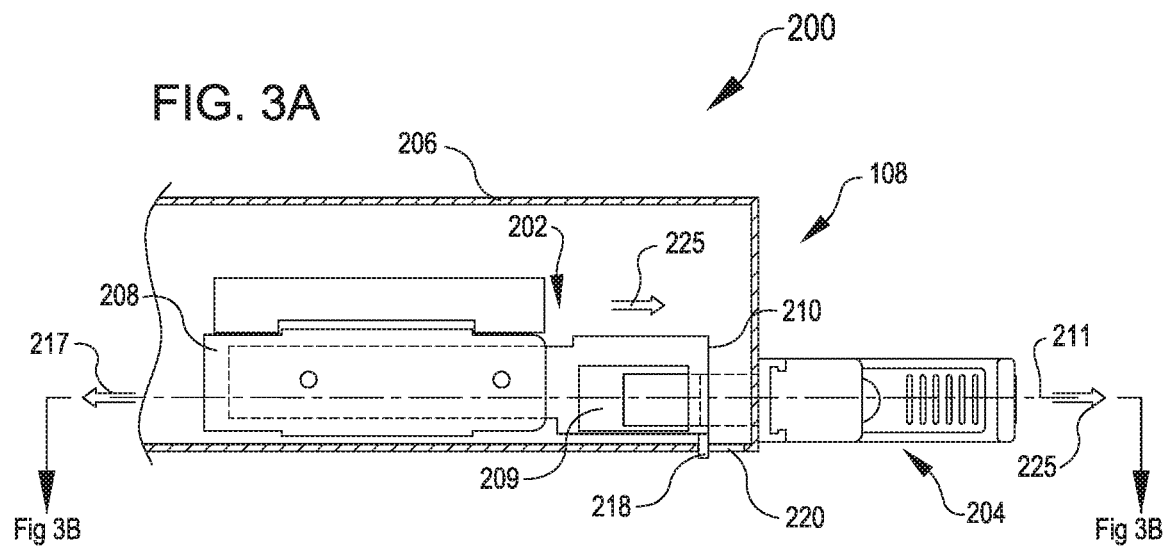
FIG. 3A illustrates a side view of the retention mechanism of FIG. 2, according to at least one example.
Figure 3B:
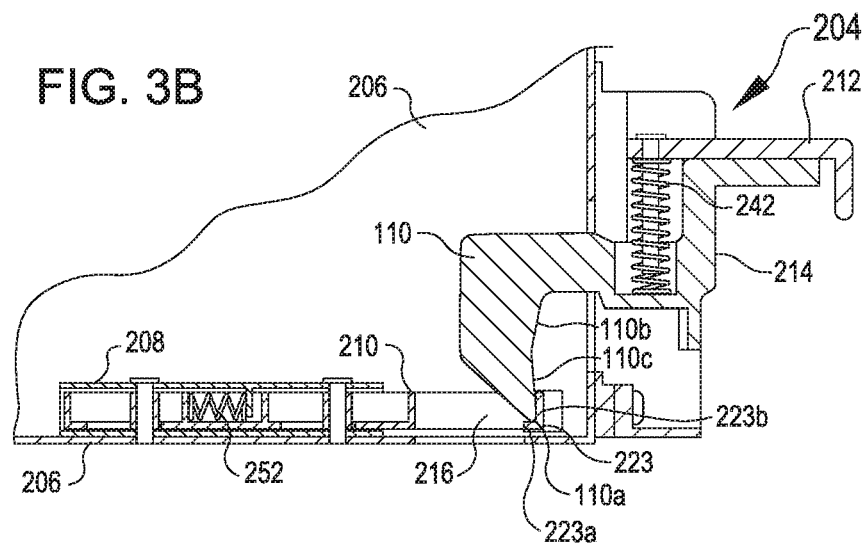
FIG. 3B illustrates a top section view of the retention mechanism of FIG. 2, according to at least one example.

As shown in FIGS. 2, 3A, and 3B, when the latching component 214 is drawn sufficiently toward the handle component 212 (e.g., by a user squeezing the two components together as illustrated by the arrows 215), the distal tip 110 (e.g., a protrusion on the end of the latch member 110) is removed from outside the case 216 and into the unlocked position illustrated in FIGS. 2, 3A, and 3B. In this position, the distal tip 110a has been drawn through the interaction opening 216 and into a recess pocket 223. Biasing in the retaining assembly 202 and the latching assembly 204 hold the distal tip 110a in the unlocked position. For example, the biasing of the latching assembly 204 drives the distal tip 110a into a first wall 223a of the recess pocket 223 of the retaining component 214. At the same time, biasing of the retaining assembly 204 drives a second wall 223b of the recess pocket 223 into the distal tip 110a and a portion of the first surface 110c. In this manner, the retaining assembly 204, being in an engaged position, retains the latching assembly 204 in the unlocked position. Thus, the unlocked position of the latching assembly 204 corresponds to the engaged position of the retaining assembly 204.

The retaining component 214 also includes a release tab 218 that extends within a tab opening 220. The tab opening 220 is formed in a bottom side of the case 206. In some examples, instead of the tab opening 220 being a through hole, a slit, or other cut out (e.g., a corner cut-out) may be provided in the case 206. In any event, the tab opening 220 may be sized to receive the release tab 218 and allow the release tab 218 to move along the axis 211. When the retaining assembly 204 is in the unlocked position, the release tab 218 is adjacent to and, in some examples, in physical contact with a rear edge of the tab opening 220. In some examples, this contact may assist in retaining the retaining component 214 in the engaged position and/or may define at least one extent of travel along the axis 211.

Figure 4:
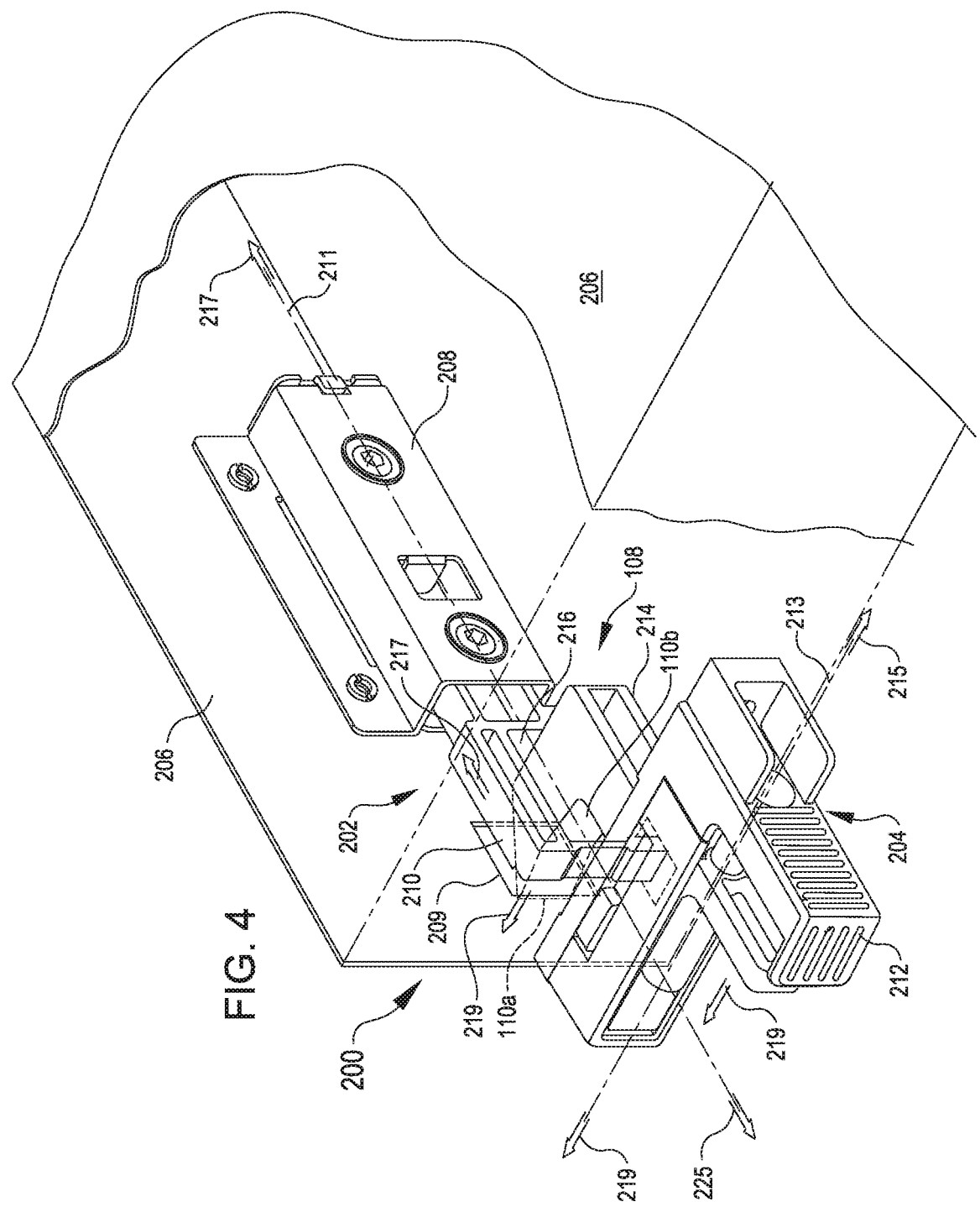
FIG. 4 illustrates a perspective view of a system including a retention mechanism in a second state, according to at least one example.
Figure 5A:
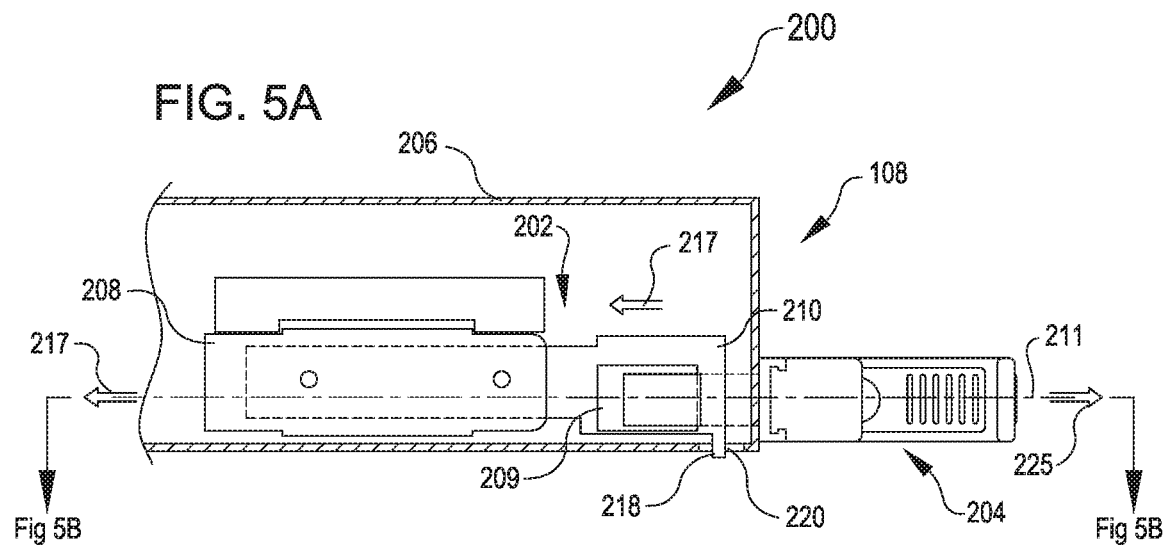
FIG. 5A illustrates a side view of the retention mechanism of FIG. 4, according to at least one example.
Figure 5B:
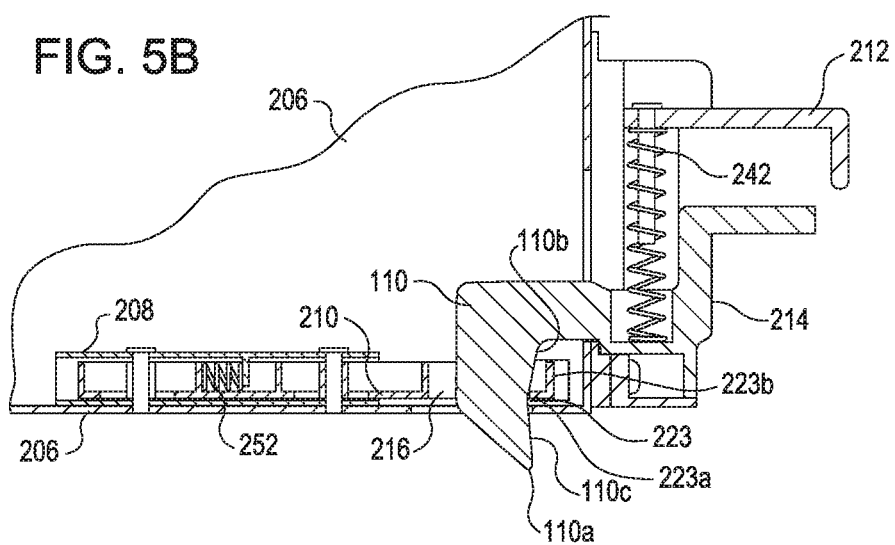
FIG. 5B illustrates a top section view of the retention mechanism of FIG. 4, according to at least one example.

As shown in FIGS. 4, 5A, and 5B, when the retaining component 210 is drawn sufficiently toward the latching assembly 204 (e.g., by the release tab 218 contacting a support bracket of a server rack and moving the retaining assembly 210 in the direction of arrow 225), the recessed pocket 223 is translated with respect to the distal tip 110a. Because the distal tip 110a is no longer disposed in the recessed pocket 223, the biasing of the latching assembly 204 causes the latch member 110 to move along the axis 213 in the direction of the arrow 219. This movement results in the distal tip 110a extending through the interaction opening 216 and into the latch member opening 209 of the case 206. As illustrated in FIG. 5A, the tab 218 has translated within the tab opening 220 toward the latching component 204. In this orientation, the retaining component 202 is in a disengaged position. Given the geometry of the latch member 110, as the latch member 110 passes through the interaction opening 116, the retaining component 210 moves nearer the latching assembly 204 (e.g., in the direction of the arrow 225) before springing back into the disengaged position illustrated in FIGS. 5A and 5B.

Movement of the retaining component 210 in the direction of the arrow 225 and movement of the latching component 214 in the direction of the arrow 219 may be triggered by the tab 218 colliding with a portion of the support bracket underneath the case 206. This collision causes the movement of the retaining component 210 first in the direction 225 until the latch member 110 passes by, and then in the direction 217.

Figure 6:
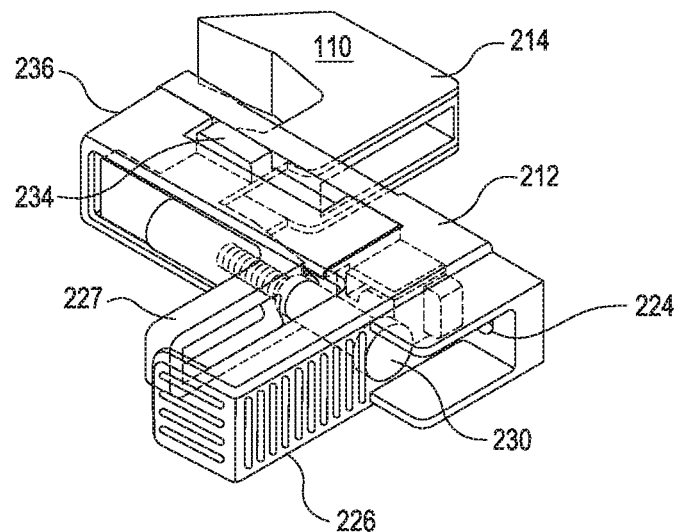
FIG. 6 illustrates an assembled perspective view of a latching assembly, according to at least one example.
Figure 7:
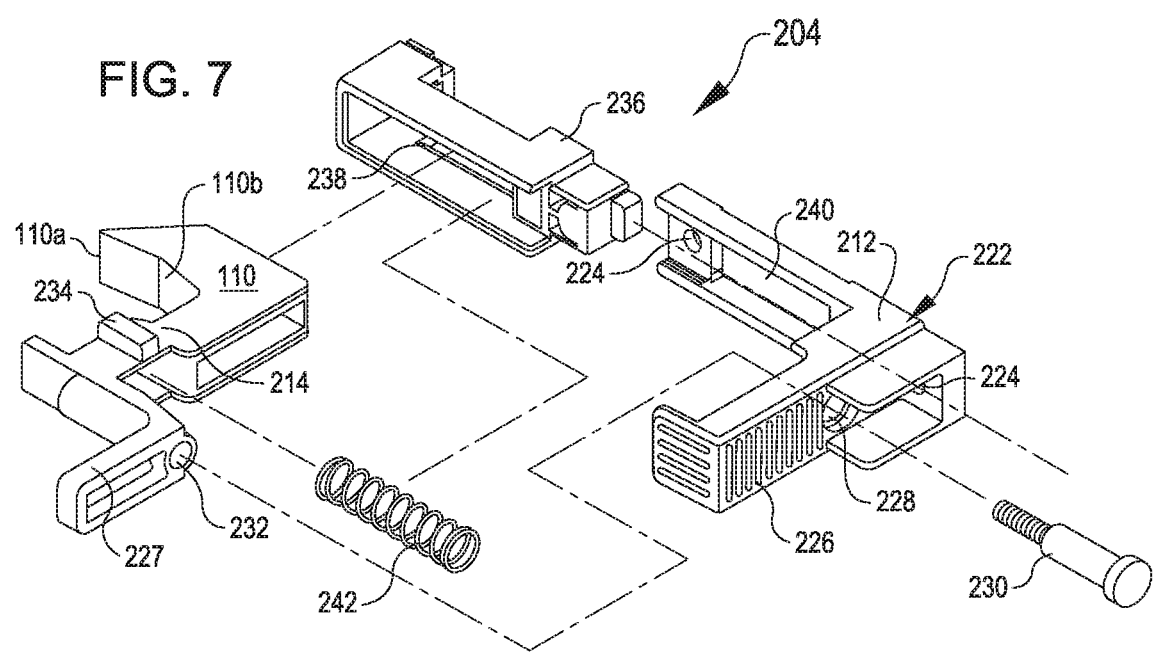
FIG. 7 illustrates an exploded view of the latching assembly of FIG. 6, according to at least one example.

FIGS. 6 and 7 respectively illustrate an assembled perspective view and an exploded view of the latching assembly 204, according to various examples. As described herein, the latching assembly 204 includes the handle component 212 and the latching component 214.

The handle component 212 is formed in a rough L shape. A first leg of the L shape includes a mounting surface 222 for connecting the handle component 212 to the case 206. For example, the handle component 212 can be connected to the case 206 at the mounting surface 222 using mounting hardware installed through holes 224. In some examples, the handle component 212 is connected to the case 206 using any suitable other connection method. A second leg of the L shape includes a handle 226. The handle 226 may be ribbed, knurled, or include some other structure to increase surface friction. This may be beneficial for gripping by a user. For example, compression forces may be applied to the handle 226 and a latch handle 227 of the latching component 214.

The handle component 212 also includes a first shaft opening 228 configured to receive a shaft 230. The first shaft opening 228 is formed in the same leg that includes the handle 226. The shaft 230, when installed, may extend through the first shaft opening 228 and into a second shaft opening 232 formed in the latching component 214. A distal portion of the shaft 230 can be connected to the second shaft opening 232 (e.g., via threads, press fit, etc.). In this manner, the shaft 230 may align the latching component 214 with the handle component 212.

The latching component 214 includes the latch member 110 connected to the latch handle 227 via a connecting body 234. The connecting body 234 engages with the handle component 212 and an alignment spacer 236 when assembled. Additionally when assembled, the latch member 110 extends through openings 238 and 240 of the alignment spacer 236 and the handle component 212.

The alignment spacer 236 functions to align the latching component 214 with the handle component 212. The alignment spacer 236 may also define the extents of a travel path for the latching component 214 (e.g., how much the latching component 214 can travel side-to-side). The shaft 230 may also define the extents of the travel path.

The shaft 230 (or other component part of the retention mechanism 108) may be configured to indicate a state of the retention mechanism. For example, a first physical portion of the shaft 230 may correspond to a first state and a second portion may correspond to a second state. When the latching assembly 204 is in the unlocked position (e.g., the latch member 110 is removed from outside the case 206), the first portion of the shaft 230 may be visible to a user. When the latching assembly 204 is in the locked position (e.g., latch member 110 extends outside the case 206), the second portion of the shaft 230 may be visible to the user. The different portions of the shaft 230 can be coated with different colors to indicate the states. For example, the first portion corresponding to the unlocked position may be painted red indicating that the retention mechanism 108 is not "locked." The second portion corresponding to the locked position may be painted green indicating that the retention mechanism is "locked."

In some examples, two states are identified at different positions on the top surface of the alignment spacer 236 that is visible to the user. For example, a locked symbol and an unlocked symbol can be applied to the top surface. An indicator may be attached to a portion of the latching component 214 that is visible to the user and moves with respect to the two symbols. When the retention mechanism 108 is in the "locked" state, the indicator may point to the locked symbol. Similarly, when the retention mechanism 108 is in an "unlocked" state, the indicator may point to the unlocked symbol.

The latching assembly 204 also includes a biasing member 242 such as a spring, elastic material such as rubber, compressed gas cylinder and piston, and any other suitable device or material having elastic properties. The biasing member 242 may be installed between the latching component 214 and the handle component 212. When biased between the latching component 214 and the handle component 212, the biasing member 242 may exert opposing forces on the two components 214, 212. Given that the handle component 212, when installed, will be securely connected to a case of a server, the biasing force may cause the latching component 214 to move with respect to the handle component 212. Thus, the latching assembly 204 may be biased to the locked position. In some examples, other biasing members other than the biasing member 242 may be uses to cause the latching component 214 to move. For example, a rubber cylinder can be used instead of or in addition to the biasing member 242.

The components of the retention mechanism 108 may be formed from any suitable material or combination of materials. For example, parts subjected to many cycles, forces, and stresses such as the latching component 214 and the retaining component 210 may be formed from a rigid material such as metal. Parts such as the alignment spacer 236, the fixed component 208, and the handle component 212 may be formed from a semi-rigid material such as plastic.

Figure 8:
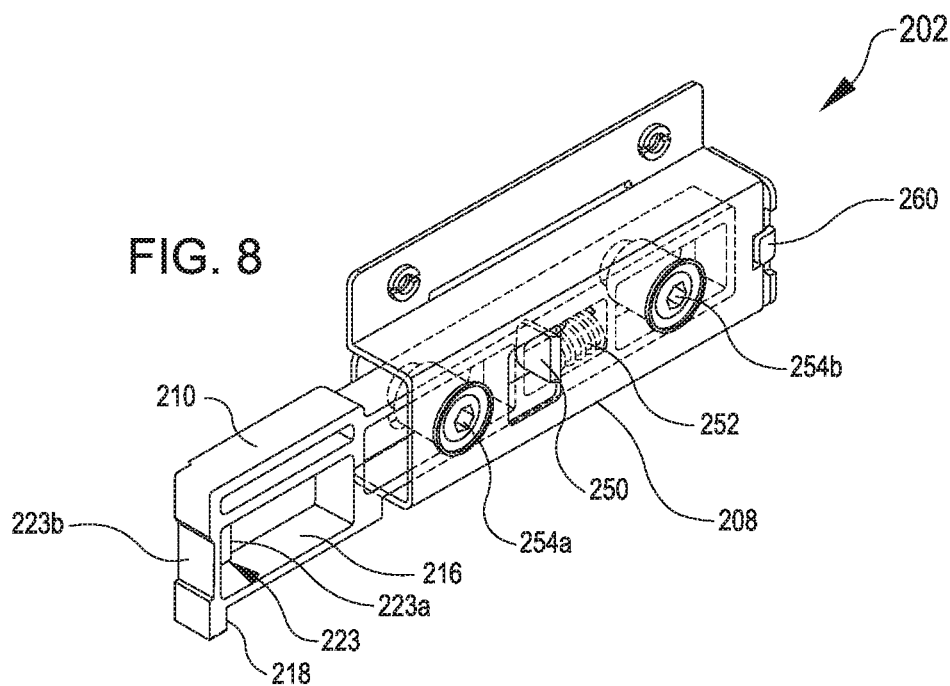
FIG. 8 illustrates an assembled perspective view of a system including a retaining assembly, according to at least one example.
Figure 9:
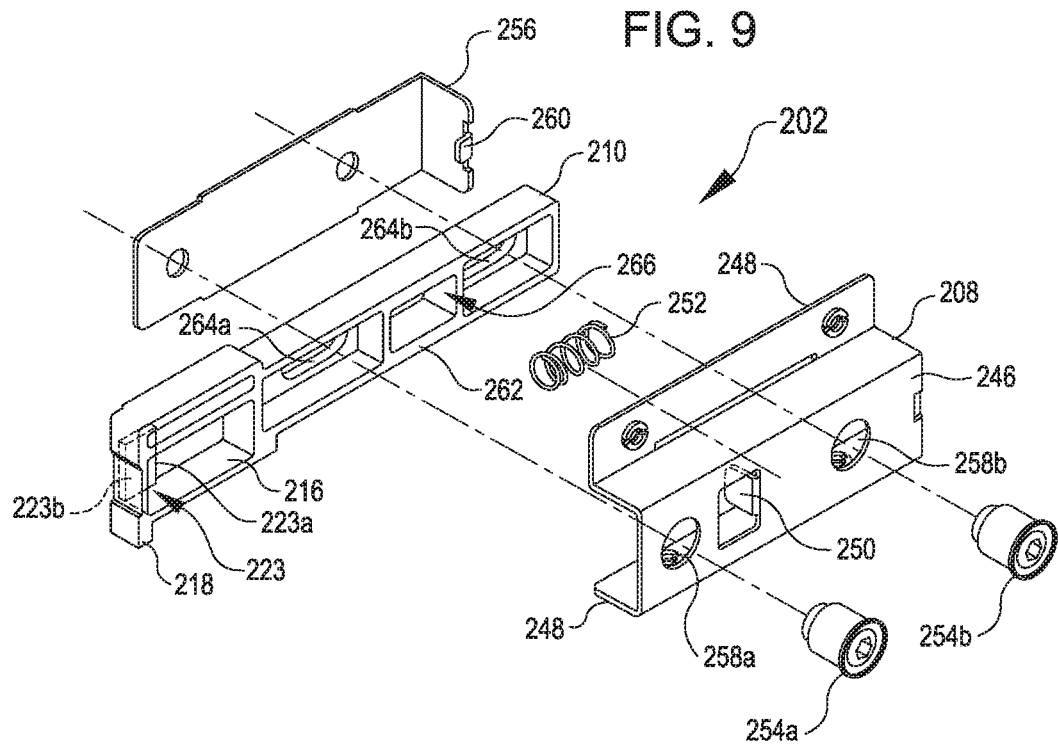
FIG. 9 illustrates an exploded view of the retaining assembly of FIG. 6, according to at least one example.

FIGS. 8 and 9 respectively illustrate an assembled perspective view and an exploded view of the retaining assembly 202, according to various examples. As described herein, the retaining assembly 202 includes the fixed component 208 and the retaining component 210. The retaining assembly 202 also includes a biasing member 252, alignment shafts 254, and a mounting panel 256.

The fixed component 208 in particular includes a body 246 having a "U" shape. The body 246 includes at least two feet 248. The feet 248 may define mounting surfaces, holes, and the like for connecting the fixed component to the case 206. For example, the feet 248 may include a pair of holes by which mounting hardware can be used to attach the fixed component 208 to the case 206.

The body 246 also includes a member 250 that extends toward the inside of the U-shape. The member 250, which may be a tab or other rigid structure, may be used to retain a first end of the biasing member 252. As described herein, the biasing member 252 may be biased between the fixed component 208 (e.g., against the member 250 of the body 246) and the retaining component 210. The body 246 also includes openings 258 to receive the alignment shafts 254. The alignment shafts 254 align the retaining component 210 with the fixed component 208 and connect the retaining assembly 202 to the case 206.

The mounting panel 256 is disposed between the case 206 and the retaining component 210. In some examples, the mounting panel 256 acts as a spacer between the wall of the case 206 and the retaining component 210. The mounting panel 256 may also include a tabbed end 260 that connects with the body 246 when installed. In this manner, the mounting panel 256 together with the body 246 define a rectangular cuboid. The retaining component 210 is configured to slide within the volume defined by the rectangular cuboid.

The retaining component 210 may include the interaction opening 216 formed at a first end of the fixed component 208. The interaction opening 216 includes the recessed pocket 223, including the first wall 223a and the second wall 223b, defined at a distal end of the retaining component 210. The latch member 110 of the latching component 214 engages with the recessed pocket 223 when the latching component 212 is moved between the unlocked position and locked position.

The retaining component 210 also includes the release tab 218. The release tab 218, which may take any suitable shape and form, is sufficiently long to extend within and through the tab opening 220. In some examples, a distal portion of the release tab 218 extends beyond a bottom surface of the case 206 through the tab opening 220. This distal portion can act as a trigger to disengage the retaining component 210 which results in locking of the latching component 214. In some examples, triggering using the distal portion of the release tab 218 can include the distal portion physically contacting a surface or an edge of a support bracket such as an L bracket. This contact causes the distal portion of the release tab 218 to translate along the axis 211. When this occurs, the biasing member 252 will be compressed to release the latching member 110. In turn, the biasing member 242 causes the latching member 110 to translate along the axis 213, as described elsewhere herein.

The retaining component 210 also includes a biasing member cavity 262 and slots 264. The biasing member cavity 262 can include a contact surface 266. When installed, the biasing member 252 can be biased between the member 250 and the contact surface 266 within the biasing member cavity 262. Thus, the retaining component 210 is biased to the engaged position.

The slots 264 may be configured to receive the alignment shafts 254. The slots 264 may have an elongated shape, with a height dimension slightly larger than an outside diameter of the alignment shafts 254 and a length dimension that defines the longitudinal travel path of the retaining component 210.

In some examples, an example method of retaining a server in a server rack may be implemented using the retention mechanism 200 connected to the server. The method may include actuating the retention mechanism to move a latch member of the retention mechanism into an unlocked position. In this position, a side wall of the server is presented without obstructions. This may be desirable when installing and removing the server to minimize items that could snag on cables or other items adjacent to the server rack. With the latch member in the unlocked position, the method may also include causing the server to slide into the server rack on a support structure. While the server is sliding on the support structure, a release tab of the retention mechanism collides with the support structure. This collision causes the latch member to automatically (e.g., without a user interacting with the retention mechanism) move out of the unlocked position. Once the server is fully installed in the support structure (e.g. pushed in all the way), the latch member may move into a latch member opening in the support structure. In this manner, the latch member retains the server in the server rack. To remove the server, the retention mechanism is again actuated to move the latch member into the unlocked position. With the latch member within the server, the server is ready to be removed from the support structure (e.g., by pulling on the retention mechanism).

Other variations are within the spirit of the present disclosure. Thus, while the disclosed techniques are susceptible to various modifications and alternative constructions, certain illustrated examples thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed examples (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate examples of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain examples require at least one of X, at least one of Y, or at least one of Z to each be present.

Various examples of this disclosure are described herein, including the best mode known to the inventors for carrying out the disclosure. Variations of those examples may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A system, comprising:
   a rack-mountable component comprising a case, the case comprising:
      a floor;
      a side wall extending up from the floor;
      a front wall extending up from the floor; and
      a first latch member opening at the side wall of the case; and
   a retention mechanism connected to an interior surface of the side wall, the retention mechanism configured to retain the rack-mountable component in a server rack in which is formed a second latch member opening, the retention mechanism comprising:
      a retaining assembly comprising:
         a fixed component being attached to the side wall; and
         a retaining component slidably coupled to the fixed component so as to slidably move with respect to the fixed component along a first axis, the retaining component comprising:
            an elongate body in which is formed an interaction opening; and
            a tab connected to the retaining component, the tab sized and configured to engage with a portion of the server rack during installation of the case into the server rack; and
      a latching assembly connected to an exterior surface of the front wall, the latching assembly comprising:
         a handle component; and
         a latching component slidably coupled to the handle component so as to move with respect to the handle component along a second axis, the latching component comprising a latch member that is sized and configured to selectively move via the interaction opening and the first and second latch member openings as the latching component moves along the second axis.

2. The system of claim 1, wherein:
   the fixed component further comprises a member connected to an interior portion and extending toward the side wall;
   the elongate body further comprises a spring cavity; and
   the retaining assembly further comprises a biasing member disposed within the spring cavity and in physical contact with the member, the biasing member being configured to bias a front portion of the retaining component away from the front wall of the case.

3. The system of claim 1, wherein:
the server rack comprises a set of horizontal support structures connected to a set of vertical support members, the set of horizontal support structures extending toward a front portion of the server rack to a position beyond the set of vertical support members; and
the set of horizontal support structures support the case, the second latch opening being formed in a first horizontal support structure of the set of horizontal support structures.

4. The system of claim 1, wherein the latching assembly comprises a position indicator that indicates a position of the latch member with respect to the second axis.

5. The system of claim 1, wherein the retaining component is configured to slidably move with respect to the fixed component along the first axis between:
an engaged position in which a distal portion of the latch member physically contacts an interior portion of the interaction opening; and
a disengaged position in which the distal portion of the latch member extends through the interaction opening.

6. The system of claim 5, wherein the latching component is configured to slidably move with respect to the handle component along the second axis between:
an unlocked position in which the distal portion of the latch member is retained outside of the second latch member opening when the retaining component is in the engaged position; and
a locked position in which the distal portion of the latch member is disposed within the second latch member opening when the retaining component is in the disengaged position.

7. A system, comprising:
a rack component case comprising a side wall and a front wall, the rack component case configured to support a rack component;
a latching component connected to the rack component case at the front wall, the latching component configured to move between a locked position in which a protrusion of the latching component extends outside the side wall and an unlocked position in which the protrusion is removed from outside the side wall; and
a retaining component configured to position the latching component in the unlocked position, wherein the retaining component is configured to move between an engaged position in which the retaining component retains the latching component in the unlocked position and a disengaged position in which the retaining component allows the latching component to remain in the locked position.

8. The system of claim 7, wherein:
the latching component is connected to the front wall at an exterior surface of the front wall; and
the retaining component is connected to the side wall at an interior surface of the side wall.

9. The system of claim 7, wherein the latching component is biased to the locked position.

10. The system of claim 7, wherein the retaining component is biased to the engaged position.

11. The system of claim 7, wherein:
the rack component case is configured to be supported by a bracket that comprises a bracket opening; and
the protrusion extends through the bracket opening when the rack component case is installed in the bracket and the latching component is in the locked position.

12. The system of claim 7, further comprising a release component positioned to engage a server rack and configured to release the retaining component when the rack component case is inserted in the server rack.

13. The system of claim 7, wherein:
the latching component is configured to move along a first axis between the locked position and the unlocked position; and
the retaining component is configured to move along a second axis to position the latching component in the unlocked position.

14. A system, comprising:
a rack component case comprising a side wall and a front wall, the rack component case configured to support a rack component;
a latching component connected to the rack component case at the front wall, the latching component configured to move between a locked position in which a protrusion of the latching component extends outside the side wall and an unlocked position in which the protrusion is removed from outside the side wall;
a retaining component configured to position the latching component in the unlocked position; and
a release component positioned to engage a server rack and configured to release the retaining component when the rack component case is inserted in the server rack.

15. The system of claim 14, wherein:
the latching component is connected to the front wall at an exterior surface of the front wall; and
the retaining component is connected to the side wall at an interior surface of the side wall.

16. The system of claim 14, wherein the latching component is biased to the locked position.

17. The system of claim 14, wherein the retaining component is configured to move between an engaged position in which the retaining component retains the latching component in the unlocked position and a disengaged position in which the retaining component allows the latching component to remain in the locked position.

18. The system of claim 17, wherein the retaining component is biased to the engaged position.

19. The system of claim 14, wherein:
the rack component case is configured to be supported by a bracket that comprises a bracket opening; and
the protrusion extends through the bracket opening when the rack component case is installed in the bracket and the latching component is in the locked position.

* * * * *